United States Patent
Kim

(10) Patent No.: US 7,848,162 B2
(45) Date of Patent: Dec. 7, 2010

(54) SEMICONDUCTOR INTEGRATED CIRCUIT HAVING WRITE CONTROLLING CIRCUIT

(75) Inventor: Taek-Seung Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 125 days.

(21) Appl. No.: 12/172,122

(22) Filed: Jul. 11, 2008

(65) Prior Publication Data

US 2009/0185436 A1    Jul. 23, 2009

(30) Foreign Application Priority Data

Jan. 22, 2008    (KR)    ...................... 10-2008-0006462

(51) Int. Cl.
    *G11C 7/00*    (2006.01)
(52) U.S. Cl. .................. 365/189.16; 365/201
(58) Field of Classification Search ............ 365/189.16, 365/201

See application file for complete search history.

(56) References Cited

U.S. PATENT DOCUMENTS

| 5,576,996 A | 11/1996 | Awaya et al. |
| 5,926,485 A | 7/1999 | Kanai |

FOREIGN PATENT DOCUMENTS

| KR | 1020040105008 A | 12/2004 |
| KR | 1020050046041 A | 5/2005 |
| KR | 1020050051135 A | 6/2005 |
| KR | 1020050079030 A | 8/2005 |

*Primary Examiner*—Michael T Tran
(74) *Attorney, Agent, or Firm*—Baker & McKenzie LLP

(57) ABSTRACT

A semiconductor integrated circuit includes a write controlling circuit configured to selectively provide a fixed pulse or a variable pulse according to a level of a test mode signal in a write operation mode, thereby adjusting a pulse width of an internal write pulse that is a current pulse driving an internal memory cell in response to the fixed pulse or the variable pulse.

11 Claims, 3 Drawing Sheets

SEMICONDUCTOR INTEGRATED CIRCUIT HAVING WRITE CONTROLLING CIRCUIT

CROSS-REFERENCES TO RELATED APPLICATION

The present application claims priority under 35 U.S.C. 119(a) to Korean application number 10-2008-0006462, filed on Jan. 22, 2008, the content of which is incorporated herein in its entirety by reference as if set forth in full.

BACKGROUND

1. Technical Field

The embodiments described herein relate to a semiconductor integrated circuit, and, more particularly, to a semiconductor integrated circuit including a write controlling circuit.

2. Related Art

Generally, most semiconductor memory manufacturing companies have developed a phase change random access memory (PRAM) that employs phase change materials and is a next generation memory device that adheres to the current trend of memory device designs that highly enhance the performance of a semiconductor integrated circuit and to lower power consumption thereof. The PRAM is a non-volatile memory device that stores data by using a material such as $Ge_xSb_yTe_z$ (hereinafter, referred to as "GST"), in which the resistance of the GST varies through phase change according to temperature variation.

In more detail, a unit memory cell of the PRAM can store data by setting one of two physical states based on the difference in the resistivity of the GST. In other words, high resistance of the GST represents a value of '1', and low resistance of the GST represents a value of '0', so that digital information can be written. Such reversible phase change of the GST of the PRAM is achieved by adjusting the time and the voltage of an electrical pulse signal applied from an external device. Therefore, the electrical resistance state of the GST is arbitrarily controlled so that data can be stored. Meanwhile, in order to change the phase of a highly-integrated PRAM cell array, a pulse signal activated under a desirable voltage and for desirable time is required in a write operation.

SUMMARY

A write controlling circuit, capable of receiving a fixture pulse or a variable pulse, which is used to control phase change in a write operation, to provide an internal write pulse having variable pulse widths is described herein.

In one aspect, a semiconductor integrated circuit can include a write controlling circuit configured to selectively provide a fixed pulse or a variable pulse according to a level of a test mode signal in a write operation mode, thereby adjusting a pulse width of an internal write pulse that is a current pulse driving an internal memory cell in response to the fixed pulse or the variable pulse.

In another aspect, a semiconductor integrated circuit can include a write controlling circuit that can be configured to selectively receive an internal pulse or an external pulse according to a level of a test mode signal to activate an internal write pulse signal such that a current is supplied to drive an internal memory cell to activate for the duration of the internal pulse or the external pulse in a write operation.

In still another aspect, a semiconductor integrated circuit can include a switching unit configured to selectively provide a path for a first pulse signal or a second pulse signal according to a level of a test mode signal, and a write controlling circuit configured to include a current driving unit variably adjusting current driving time in response to an output signal of the switching unit, wherein the first pulse signal is a pulse signal according to delay time of a delay unit, and the second pulse signal is provided through an external pad.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

It will be clear that the embodiments described herein may be practiced without some or all of these specific details. In other instances, well known process operations have not been described in detail in order not to unnecessarily obscure the description of these embodiments.

According to one embodiment, a predetermined pulse can be applied from an external source in addition to a fixed pulse, so that a pulse width of an internal write pulse required in a write operation can be variously employed to adjust phase change of a phase material. In other words, if a pulse having a sufficiently wide pulse width is required in a write operation, a variable pulse, which has activation duration longer than that of an internal write pulse with a predetermined pulse width, can be applied from an external source. In addition, if a pulse having an excessively long pulse width is applied in a write operation, a variable pulse, which has activation duration shorter than that of the internal write pulse with a predetermined pulse width, can be applied from an exterior so that current consumption is prevented. A simple switching unit can be employed, so that pulse signals are selectively provided according to a test mode signal. Therefore, a pulse width of the internal write pulse required in a write operation can be adjusted.

Hereinafter, a semiconductor integrated circuit 1 configured so as to implement the above and according to one embodiment, will be described with reference to accompanying drawings.

Figure 1:
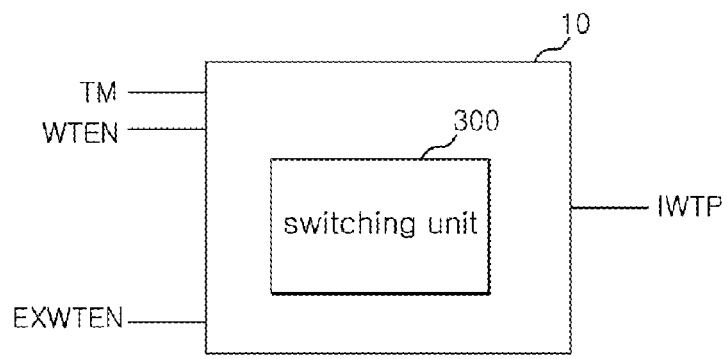
FIG. 1 is a block diagram showing a semiconductor integrated circuit including a write controlling circuit, in accordance with one embodiment.

FIG. 1 is a schematic block diagram showing the semiconductor integrated circuit 1 including a write controlling circuit 10, in accordance with one embodiment.

Referring to FIG. 1, the write controlling circuit 10 can include a switching unit 300. The switching unit 300 can be configured to selectively switch a signal path according to an internal write activation signal "WTEN" or an external write activation signal "EXWTEN" in response to a test mode signal "TM."

Accordingly, the write controlling circuit 10 can be configured to provide an internal write pulse IWTP having a variable pulse width in response to the internal write activation signal "WTEN" or the external write activation signal "EXWTEN" according to the test mode signal "TM." The details thereof will be described with reference to FIG. 2.

Figure 2:
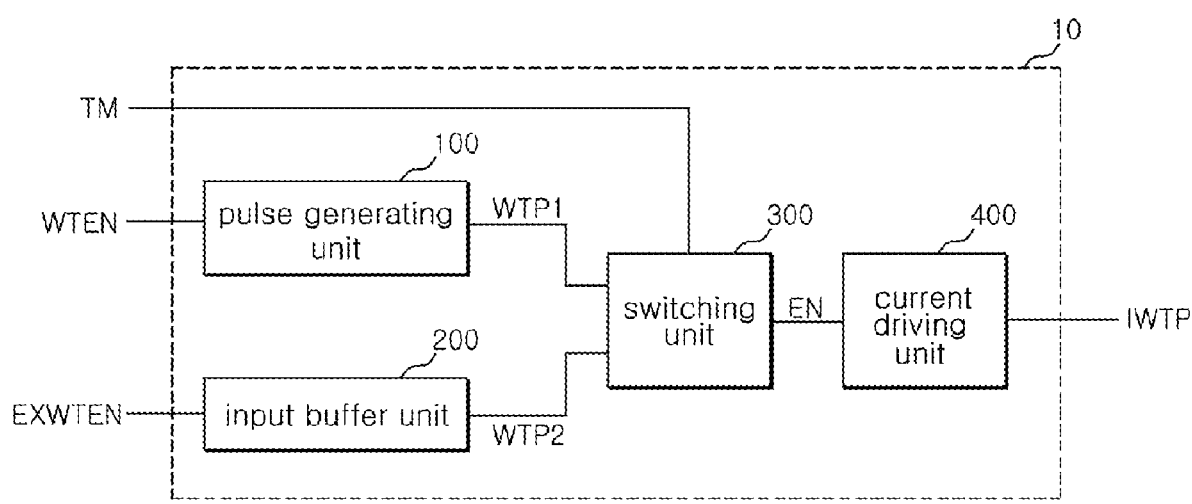
FIG. 2 is a block diagram showing a write controlling circuit included in the circuit of FIG. 1, in accordance with one embodiment.

FIG. 2 is a detailed block diagram showing the write controlling circuit 10 of FIG. 1.

Referring to FIG. 2, the write controlling circuit 10 can include a pulse generating unit 100, an input buffer unit 200, the switching unit 300, and a current driving unit 400.

The pulse generating unit 100 can be configured to provide a first pulse signal "WTP1" in response to the internal write activation signal "WTEN." The internal write activation signal "WTEN" can represent a signal activated for predetermined time such that circuits for a write operation can be driven, if a write command is activated. In other words, the internal write activation signal "WTEN" can be generated from the inside of a semiconductor integrated circuit according to an external write command. The pulse generating unit 100 can be configured to provide the first pulse signal "WTP1" having a fixed pulse width in response to such an internal write activation signal "WTEN."

The input buffer unit 200 can be configured to receive the external write activation signal "EXWTEN" to provide a second pulse signal "WTP2." Such an input buffer unit 200 represents a typical buffer to buffer the external write activation signal "EXWTEN" applied from an external pad (not shown). The external write activation signal "EXWTEN" can be applied from an external device for a write operation, and can have a pulse width more variable than that of the first pulse signal "WTP1." In other words, the external write activation signal "EXWTEN" refers to a signal having a variable pulse width, which can be directly applied to the pad (not shown) from an external source in response to an external write command. Therefore, the input buffer unit 200 can be configured to buffer the external write activation signal "EXWTEN" applied from the pad (not shown) to provide the second pulse signal "WTP2" that is an internal signal.

The switching unit 300 can be configured to selectively provide the first pulse signal "WTP1" or the second pulse signal "WTP2" in response to the test mode signal "TM" as described above, in accordance with one embodiment. In other words, the switching unit 300 can be configured to selectively provide the first pulse signal "WTP1" or the second pulse signal "WTP2" according to a level of the test mode signal "TM."

The current driving unit 400 can be configured to generate the internal write pulse signal "IWTP" to induce a phase change in an internal memory cell (not shown) according to the pulse width of an activation signal "EN" received therein from the switching unit 300. In other words, the current driving unit 400 can be configured to variably adjust the width of activation duration of the write pulse signal "IWTP" according to the pulse width of the activation signal "EN," so that an amount of current driven in the internal memory cell (not shown) can be controlled. Details thereof will be given later.

Figure 3:
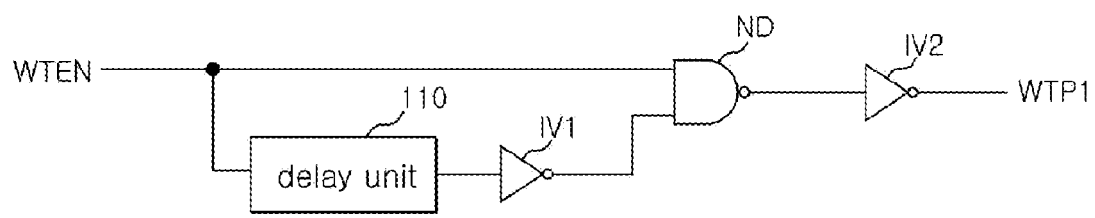
FIG. 3 is a circuit diagram showing a pulse generator included in the circuit of FIG. 2, in accordance with one embodiment.

FIG. 3 is a circuit diagram showing the pulse generating unit 100 of FIG. 2.

Referring to FIG. 3, the pulse generating unit 100 can include a delay unit 110, first to second inverters IV1 and IV2, and a NAND gate ND.

The pulse generating unit 100 can be configured to receive the internal write activation signal "WTEN" to generate the first pulse signal "WTP1" having a fixed pulse width. Since the pulse generating unit 100 is a typical pulse generator, this is generally known to those skilled in the art. Accordingly, the structure and the operation of the pulse generating unit 100 will not be described in detail.

The pulse generating unit 100 can be configured to generate the first pulse signal "WTP1" having a predetermined pulse width according to delay time of a plurality of delay elements of the delay unit 110 if the internal write activation signal "WTEN" is activated. In this case, the delay unit 110 can be designed such that the delay elements of the delay unit 110 have predetermined delay time sufficient for changing the phase of the internal memory cell (not shown) in a write operation. Accordingly, the first pulse signal "WTP1" can have a fixed pulse width corresponding to the delay time that has already been preset in the delay unit 110.

Figure 4:
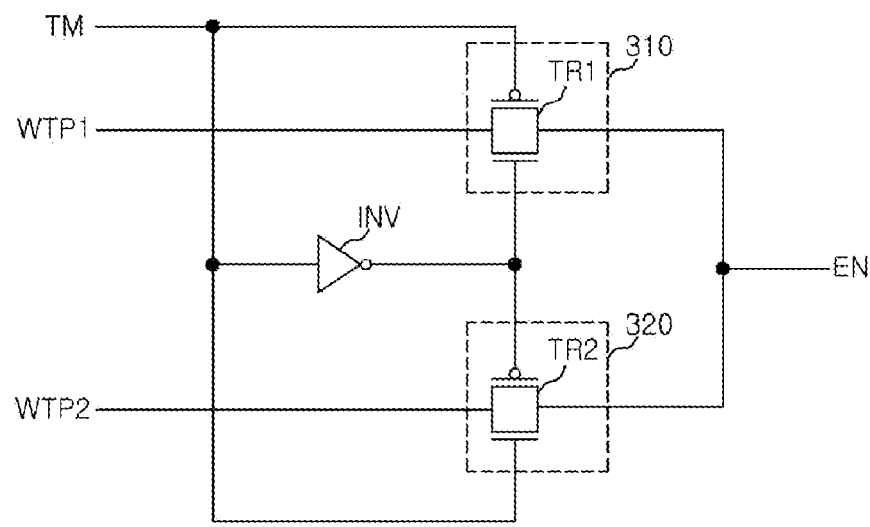
FIG. 4 is a circuit diagram showing a switching unit included in the circuit of FIG. 2, in accordance with one embodiment.

FIG. 4 is a circuit diagram showing the switching unit 300 of FIG. 2.

Referring to FIG. 4, the switching unit 300 can include first and second transmission units 310 and 320.

If the first transmission unit 310 is turned on in response to the test mode signal "TM," the first transmission unit 310 can provide the first pulse signal "WTP1." The first transmission unit 310 can include a first pass gate TR1. The first pass gate TR1 can be turned on in response to a low level of the test mode signal "TM." In other words, if the first pass gate TR1 receives the test mode signal "TM" that is deactivated, the first pass gate TR1 may transfer the first pulse signal "WTP1" in response to the test mode signal "TM."

If the second transmission unit 320 is turned on in response to the test mode signal "TM," the second transmission unit 320 can provide the second pulse signal "WTP2." The second transmission unit 320 can include a second pass gate TR2. The second pass gate TR2 can be turned on in response to a high level of the test mode signal "TM." In other words, if the second pass gate Tr2 receives the test mode signal "TM" that is activated, the second pass gate Tr2 may transfer the second pulse signal "WTP2" in response to the test mode signal "TM."

In brief, according to the level of the test mode signal "TM," the first pulse signal "WTP1" may have a signal path different from that of the second pulse signal "WTP2."

First, hereinafter, details will be given in relation to the operation of the switching unit 300 when the test mode signal "TM" is deactivated. If the test mode signal "TM" becomes deactivated, that is, becomes a low level, the first pass gate TR1 can be turned on, so that the first pulse signal "WTP1" serves as the activation signal "EN."

In contrast, if the test mode signal "TM" becomes activated, that is, a high level, the second pass gate TR2 can be turned on, so that the second pulse signal "WTP2" serves as the activation signal "EN."

As described above, the first pulse signal "WTP1" can have a predetermined pulse width in response to the internal write activation signal "WTEN." The first pulse signal "WTP1" can have a fixed pulse width corresponding to the delay time which is preset in the delay unit 110. However, since the second pulse signal "WTP2" can be applied from an external source, the second pulse signal "WTP2" may have a variable pulse width according to the intent of the engineer. Therefore, according to one embodiment, the activation signal "EN" may have a pulse width varying according to the level of the test mode signal "TM."

Figure 5:
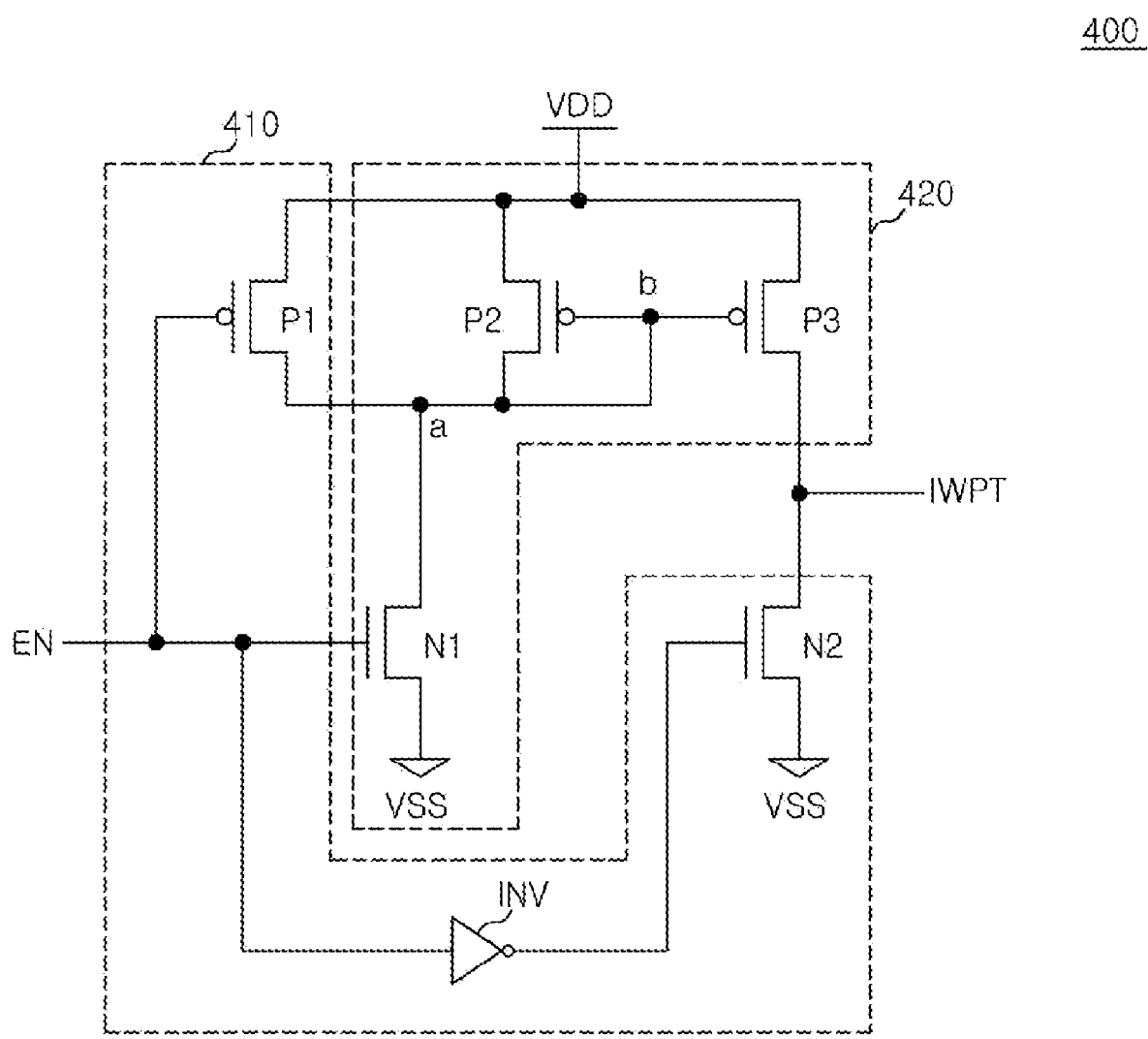
FIG. 5 is a circuit diagram showing a current driving unit included in the circuit of FIG. 2, in accordance with one embodiment.

FIG. 5 is a circuit diagram showing the current driving unit 400 of FIG. 2.

Referring to FIG. 5, the current driving unit 400 can include a controlling unit 410 and a driving unit 420. The current driving unit 400 can provide the internal write pulse signal "IWTP" in response to the activation signal "EN." In other words, the current driving unit 400 can be configured to activate the internal write pulse signal "IWTP" such that current is supplied to the internal memory cell (not shown) during the activation of the activation signal "EN."

In more detail, the controlling unit 410 can include a first PMOS transistor P1, an inverter INV, and a second NMOS transistor N2. If such a controlling unit 410 receives the activation signal "EN" that is deactivated, the controlling unit 410 can provide the internal write pulse signal "IWTP" that is deactivated.

In detail, the first PMOS transistor P1 can include a gate receiving the activation signal "EN," a source connected to an external voltage VDD, and a drain connected to a node "a". The second NMOS transistor N2 can include a gate receiving the activation signal "EN" inverted by the inverter INV, a drain connected to an output node that outputs the internal write pulse signal IWTP, and a source connected to a grounding voltage VSS.

The driving unit 420 can include a first NMOS transistor N1, and second and third PMOS transistors P2 and P3.

The first NMOS transistor N1 can include a gate receiving the activation signal "EN," a drain connected to the node "a", and a source connected to the grounding voltage VSS. The first NMOS transistor N1 can be activated during the activation of the activation signal "EN" to sink a signal of the node "a".

The second and third transistors P2 and P3 can be connected to each other in a current mirror type. The second and third PMOS transistors P2 and P3 can include gates connected to a common node b and sources commonly connected to the external voltage VDD. Meanwhile, the drain of the second PMOS transistor P2 can be connected to the node "a", and the drain of the third PMOS transistor P3 can be connected to the output node.

Particularly, the first NMOS transistor N1 and the third PMOS transistor P3 of the current driving unit 400 can be configured to serve to drive a current, and the amount of current driven by the transistors may be determined based on the ratio between the sizes of the first NMOS transistor N1 and the third PMOS transistor P3. For example, the size of the third PMOS transistor P3 is changed based on the size of the first NMOS transistor N1, thereby increasing or reducing the amount of a driven current.

Hereinafter, the operation of the current driving unit 400 will be described with respect to FIG. 5.

If the current driving unit 400 receives the low-level activation signal "EN" that is deactivated, the first PMOS transistor P1 and the second NMOS transistor N2 can be turned on. Accordingly, since the second NMOS transistor N2 is turned on, the voltage of a node that outputs the internal write pulse signal "IWTP" can be sunk, so that the internal write pulse signal "IWTP" becomes a low level.

Meanwhile, if the current driving unit 400 receives the high-level activation signal "EN" that is activated, the first NMOS transistor N1 can be turned on, so that the node "a" has a low level. Since the node "a" is connected to the node b, the second and third PMOS transistors P2 and P3 are turned on. Therefore, the internal write pulse signal "IWTP" can have an activation duration corresponding to the level of the external voltage VDD. Accordingly, when the activation signal "EN" is in a high level, the internal write pulse signal "IWTP" can have an activation duration of the high level, so that current required in a write operation for the internal memory cell (not shown) can be supplied. In other words, the activation duration of the internal write pulse signal "IWTP" can be determined according to the activation duration of the activation signal "EN."

Conventionally, such an activation signal "EN" can have a pulse width fixed by the delay unit (see reference number 110 of FIG. 3) having designed delay time. Therefore, the internal write pulse signal "IWTP" can supply a current to the internal memory cell (not shown) only for a predetermined activation duration of the internal write pulse signal "IWTP" corresponding to the activation duration of the activation signal "EN" having a fixed pulse width. Accordingly, in a highly integrated memory cell, the internal write pulse signal "IWTP" that must induce the phase change may insufficiently have current driving time.

However, according to one embodiment, a pulse signal having a predetermined activation duration may be directly applied from an external device for the activation duration of the test mode signal "TM" (see FIG. 1). Accordingly, a pulse signal, which is directly applied from the external device, can be provided to a phase change memory device as the activation signal "EN." Therefore, if necessary, when a write margin is insufficient, a pulse signal having a predetermined long activation duration may be applied from an external device. Thus, as the activation duration of the internal write pulse signal "IWTP" is lengthened, a phase change can be sufficiently induced in a write operation.

If the first pulse (see WTP1 of FIG. 2) has excessively long activation duration, current consumption may be increased.

Through the above method, a pulse signal, which has an activation duration that is narrower than a pulse width of the first pulse signal (see "WTP1" of FIG. 2), is applied from an external device for the activation duration of the test mode signal "TM." Accordingly, the induction of the phase change can be determined in a write operation. Thus, the internal write pulse signal "IWTP" required in a write operation can be optimized.

In one embodiment, variable pulse signals can be applied from an external device, and selectively provided by the switching unit in a test mode, thereby providing the optimized internal write pulse signal "IWTP" in a write operation. Accordingly, the width of a current pulse signal can be checked when a write operation is performed in an internal circuit. In addition, since the current pulse required in the write operation can be obtained without an additional test program, the reliability of a cell can be improved.

It will be apparent to those skilled in the art that various modifications and changes may be made without departing from the scope and spirit of the embodiments described herein. Therefore, it should be understood that the above embodiments are not limitative, but illustrative in all aspects. The scope of the above embodiments are defined by the appended claims rather than by the description preceding them, and therefore all changes and modifications that fall within metes and bounds of the claims, or equivalents of such metes and bounds are therefore intended to be embraced by the claims.

What is claimed is:

1. A semiconductor integrated circuit comprising a write controlling circuit configured to selectively provide a fixed pulse or a variable pulse according to a level of a test mode signal in a write operation mode, thereby adjusting a pulse width of an internal write pulse that is a current pulse driving an internal memory cell in response to the fixed pulse or the variable pulse, wherein the write controlling circuit includes:
a pulse generating unit configured to generate a first pulse, which is the fixed pulse, in response to an internal write activation signal that is activated in a write operation;
an input buffer unit configured to buffer the variable pulse applied from an external device to provide the variable pulse as a second pulse in the write operation;
a switching unit configured to selectively provide the first pulse or the second pulse according to the level of the test mode signal; and
a current driving unit configured to generate the internal write pulse signal in response to an output signal of the switching unit.

2. The semiconductor integrated circuit of claim 1, wherein the pulse generating unit includes a delay unit including a plurality of delay elements and wherein the pulse generating unit is configured to generate the first pulse having a predetermined pulse width according to a number of the delay elements.

3. The semiconductor integrated circuit of claim 1, wherein the switching unit includes:
a first transmission unit configured to be turned on if the test mode signal is deactivated, thereby transferring the first pulse; and
a second transmission unit configured to be turned on if the test mode signal is activated, thereby transferring the second pulse signal.

4. The semiconductor integrated circuit of claim 1, wherein the current driving unit is configured to activate the internal write pulse signal during activation of the output signal of the switching unit.

5. A semiconductor integrated circuit comprising a write controlling circuit configured to selectively receive an internal pulse or an external pulse according to a level of a test mode signal to activate an internal write pulse signal such that a current is supplied to drive an internal memory cell for activation duration of the internal pulse or the external pulse in a write operation,
wherein the write controlling circuit includes:
a pulse generating unit configured to generate a first pulse, which has a fixed pulse width and is the internal pulse, in response to an internal activation signal activated in a write operation;
an input buffer unit configured to buffer a variable pulse, which is the external pulse, to provide the variable pulse as a second pulse in a write operation;
a switching unit configured to selectively provide the first pulse or the second pulse according to the level of the test mode signal; and
a current driving unit configured to generate the internal write pulse in response to an output signal of the switching unit.

6. The semiconductor integrated circuit of claim 5, wherein the pulse generating unit includes a delay unit including a plurality of delay elements and wherein the pulse generating unit is configured to generate the first pulse having a predetermined pulse width according to a number of the delay elements.

7. The semiconductor integrated circuit of claim 5, wherein the switching unit includes:
a first transmission unit configured to be turned on if the test mode signal is deactivated, thereby transferring the first pulse; and
a second transmission unit configured to be turned on if the test mode signal is activated, thereby transferring transfer the second pulse.

8. The semiconductor integrated circuit of claim 5, wherein the current driving unit is further configured to activate the internal write pulse during activation of the output signal of the switching unit.

9. A semiconductor integrated circuit comprising:
a switching unit configured to selectively provide a path for a first pulse signal or a second pulse signal according to a level of a test mode signal; and
a write controlling circuit configured to include a current driving unit variably adjusting current driving time in response to an output signal of the switching unit, wherein the first pulse signal is a pulse signal according to delay time of a delay unit and wherein the second pulse signal is provided through an external pad,
wherein the switching unit includes:
a first transmission unit configured to be turned on if the test mode signal is deactivated, thereby transferring the first pulse; and
a second transmission unit configured to be turned on if the test mode signal is activated, thereby transferring the second pulse.

10. The semiconductor integrated circuit of claim 9, wherein the current driving unit includes:
a controlling unit configured to deactivate an internal write pulse used to drive an internal memory cell in a write operation if receiving a deactivated output signal of the switching unit; and
a driving unit configured to activate the internal write pulse during activation of the output signal of the switching unit if receiving an activated output signal of the switching unit.

11. The semiconductor integrated circuit of claim 10, wherein the current driving unit is driven for predetermined fixture time if the test mode signal is deactivated and wherein the current driving unit is variably driven for activation duration of the second pulse signal provided from an exterior if the test mode signal is activated.

* * * * *